United States Patent
Lammers et al.

(10) Patent No.: US 10,370,755 B2
(45) Date of Patent: Aug. 6, 2019

(54) METHOD FOR PRODUCING PISTON A RING

(71) Applicant: FEDERAL-MOGUL BURSCHEID GMBH, Burscheid (DE)

(72) Inventors: Ralf Lammers, Wermelskirchen (DE); Christiane Bauer, Burscheid (DE); Yurly Ivanov, Bergisch-Gladbach (DE)

(73) Assignee: Wilmington Trust, National Association, as Collateral Trustee, Minneapolis, MN (US)

( * ) Notice: Subject to any disclaimer, the term of this patent is extended or adjusted under 35 U.S.C. 154(b) by 795 days.

(21) Appl. No.: 14/896,179

(22) PCT Filed: May 10, 2014

(86) PCT No.: PCT/DE2014/000242
§ 371 (c)(1),
(2) Date: Dec. 4, 2015

(87) PCT Pub. No.: WO2014/194874
PCT Pub. Date: Dec. 11, 2014

(65) Prior Publication Data
US 2016/0122862 A1    May 5, 2016

(30) Foreign Application Priority Data
Jun. 4, 2013    (DE) .......... 10 2013 009 369

(51) Int. Cl.
*F16J 9/26*    (2006.01)
*F16J 9/28*    (2006.01)
*C23C 14/06*    (2006.01)

(52) U.S. Cl.
CPC ...... *C23C 14/0617* (2013.01); *C23C 14/0641* (2013.01); *F16J 9/26* (2013.01); *F16J 9/28* (2013.01)

(58) Field of Classification Search
CPC ......... F16J 9/12; F16J 9/14; F16J 9/26; C23C 14/0641; C23C 14/542; C23C 28/044
See application file for complete search history.

(56) References Cited

U.S. PATENT DOCUMENTS

| | | | |
|---|---|---|---|
| 5,380,018 A | 1/1995 | Mader et al. | |
| 7,052,019 B2 * | 5/2006 | Miida | C23C 14/505 277/443 |

(Continued)

FOREIGN PATENT DOCUMENTS

| | | |
|---|---|---|
| CN | 1492978 A | 4/2004 |
| CN | 102575768 A | 7/2012 |

(Continued)

OTHER PUBLICATIONS

Extract of "Kolbenringhandbuch der Federal-Mogul Burscheid GmbH" (pp. 6, 7, 18 and 19) with English translation, Apr. 2003.

*Primary Examiner* — Nicholas L Foster
(74) *Attorney, Agent, or Firm* — Norris McLaughlin, P.A.

(57) ABSTRACT

A piston ring is produced in which a piston ring base body made of cast iron or cast steel is coated with at least one PVD layer having a variable layer thickness, such that an increased layer thickness is present in the region of the ring ends compared to the remaining circumferential region of the piston ring base body, wherein the piston ring base body is configured so that, in the cold operating state with the engine not running, the radial pressure distribution of the piston ring base body is such that the ring ends exhibit substantially no radial pressure across a defined circumferential angle, and the variable layer thickness of the PVD layer is set so that a substantially uniform radial pressure distribution is present along the entire ring circumference of the piston ring at a piston ring temperature above 150° C.

18 Claims, 1 Drawing Sheet

(56) References Cited

U.S. PATENT DOCUMENTS

| | | | |
|---|---|---|---|
| 8,157,268 B2* | 4/2012 | Tomanik | F16J 9/14 |
| | | | 277/434 |
| 8,979,094 B2* | 3/2015 | Esser | F16J 9/12 |
| | | | 277/442 |
| 2004/0056425 A1 | 3/2004 | Miida | |
| 2010/0044969 A1 | 2/2010 | Fischer et al. | |
| 2010/0090416 A1* | 4/2010 | Tomanik | F16J 9/14 |
| | | | 277/499 |
| 2012/0228831 A1 | 9/2012 | Herbst-Dederichs et al. | |
| 2013/0307221 A1 | 11/2013 | Esser | |
| 2014/0096736 A1 | 4/2014 | Baerenreuter et al. | |
| 2017/0306469 A1* | 10/2017 | Da Rocha Mordente | |
| | | | C23C 14/044 |

FOREIGN PATENT DOCUMENTS

| | | |
|---|---|---|
| DE | 944 468 | 6/1956 |
| DE | 41 40 232 | 7/1993 |
| DE | 10 2009 052 587 | 5/2011 |
| DE | 10 2010 046 551 | 3/2012 |
| DE | 10 2011 010 656 | 8/2012 |
| EP | 1 359 351 | 11/2003 |
| JP | 2001-295699 | 10/2001 |
| JP | 2002-195409 A | 7/2002 |
| JP | 2008-105937 A | 5/2008 |
| JP | 2010-506083 A | 2/2010 |
| JP | 2011-133018 A | 7/2011 |
| WO | 2012/160138 A1 | 11/2012 |

\* cited by examiner mmm # METHOD FOR PRODUCING PISTON A RING

BACKGROUND OF THE INVENTION

The invention relates to a method for producing a piston ring made of cast iron or cast steel.

It is generally known to provide piston rings with wear-resistant layers. In many instances, very hard PVD (physical vapor deposition) layers are deposited on the running face. It is known from engine operation that piston rings, in particular in the first groove, at the joint are subject to greater wear than at the ring back. At the same time, the PVD layer impairs the radial pressure distribution of the ring during engine operation. Due to the differing thermal expansion of the coatings and the base material (bimetallic effect), the pressure at the joint increases, thereby favoring even higher wear in this region. This also results in a higher load on the counter-body, and consequently also in higher wear on the same.

JP 2001-295699 A1 discloses a piston ring comprising a coated running face. The running face of this piston ring is provided with a hard PVD layer. A further layer is deposited on the same, which has improved running-in properties than the hard PVD layer. This measure is intended to provide optimized pressure distribution, seen in the circumferential direction of the piston ring, since the running-in layer is ablated relatively quickly in the region of the piston ring close to the joint.

EP 1 359 351 B1 relates to a generic method. A base body provided with a joint is caused to rotate and is rotated around an evaporation source. Differing layer thicknesses are created, looking at the circumference of the base body, as a result of differing rotational speeds. The layer thickness in the joint region should be larger than in the remaining circumferential region.

SUMMARY OF THE INVENTION

Given the differing coefficients of thermal expansion of the piston ring base material and the PVD layer, starting at a ring temperature of approximately 150° C. the radial pressure distribution during operation of the engine changes, to the effect that an increased radial pressure is formed in the joint region.

It is the object of the invention to increase the service life of a PVD-coated piston ring, wherein, at the same time, the counter-body should not be subjected to any increased wear or increased load.

This object is achieved by working the piston ring base body so that, in the cold operating state with the engine not running, the radial pressure distribution of the same is such that the ring ends have substantially no radial pressure across a defined circumferential angle, and by setting the variable layer thickness of the PVD layer so that a substantially uniform radial pressure distribution is present over the entire ring circumference of the piston ring at a piston ring temperature above 150° C.

Advantageous refinements of the method according to the application are also disclosed hereinbelow.

This object is also achieved by a piston ring that is produced using the method according to the invention.

The piston ring provided with a joint comprises a base body, made of cast steel or cast iron, having at least one wear-resistant PVD layer applied to the outer circumferential surface, wherein the PVD layer in the region of the piston ring base body which is close to the joint, looking at a defined circumferential region, is designed to have a greater material thickness than in the remaining circumferential region.

According to a further aspect of the invention, a PVD layer having a coefficient of expansion $<4\times10^{-6}$/K is applied to a piston ring base body that is made of a cast steel material, or cast iron, and has a coefficient of expansion $<15\times10^{-6}$/K in the temperature range between 100 and 200° C.

The layer thickness of the PVD layer in the region close the joint is advantageously designed to be between 20 and 40% thicker than in the remaining circumferential region.

According to a further aspect of the invention, the layer thickness of the PVD layer in the region close to the joint is between >40 and 100 µm, and the layer thickness of the PVD layer in the remaining circumferential region is between 5 and 60 µm.

If the PVD layer is designed as a multi-layer system (such as AlTiN/CrN) or as a homogeneous layer, such as CrN, CrN(O) or CrN having an oxygen content of up to 15% by weight, it advantageously has a coefficient of thermal expansion $<4\times10^{-6}$/K in the temperature range between 100 and 200° C., wherein the layer thickness of the PVD layer is between 5 and <40 µm in the region of the piston ring back and between 40 and <100 µm in the region close to the joint. By the "back" of the piston ring is meant the region not close to the joint, i.e., remote from the joint.

If the PVD layer is carbon-based, according to a further idea of the invention it has a coefficient of thermal expansion $<2\times10^{-6}$/K in the temperature range between 100 and 200° C., wherein the layer thickness of the PVD layer is between >1 and 20 µm in the region of the piston ring back and a maximum of 30 µm in the region close to the joint.

If needed, the PVD layer may also be provided with nanoparticles.

According to a further aspect of the invention, the region close to, i.e., proximate, the joint is provided with the thicker PVD layer starting from each ring end in an angular range of 10 to 40°. In other words, that is the region which is "close" to or proximate the joint and the remaining region is the "back" or "remote" region of the joint.

By way of suitable process control during the coating process, a variable layer thickness is generated across the circumference of the piston ring base body. As was already addressed, the PVD wear protection layer is designed to be considerably thicker in the region close to the joint so as to address the increased wear and thereby significantly increase the service life of the piston ring thus implemented.

The original layer thickness is maintained over the remainder of the circumference, in particular at the ring back. This does not intensify the bimetallic effect of the layer.

During use, the ring shape, and in particular the ring shape of the hot piston ring, can be controlled by a targeted layer structure, such as a cylinder bore surface, so that the ring ends exert considerably less pressure on the counter-body.

Since, according to the invention, the ring ends of the cold piston ring develop almost no radial pressure, in the ideal application case, the bimetallic effect, which cannot be suppressed, results in uniform radial pressure distribution across the entire ring circumference at piston ring temperatures starting at 150° C. This measure also allows the piston ring shape to be favorably influenced, whereby the pressure at the joint is reduced, and thus increased wear, in particular in the region close to the joint, is counteracted.

The piston ring according to the invention is versatile to use. Conceivable applications include internal combustion engines in vehicles (passenger cars, trucks, buses), industrial applications (such as stationary engines), construction vehicles, locomotives, and ships. Applications in the diesel engine field, in particular large two-cycle diesel engines, are preferred.

The subject matter of the invention is shown in the drawings based on an exemplary embodiment and is described as follows.

DETAILED DESCRIPTION OF THE INVENTION

Figure 1:
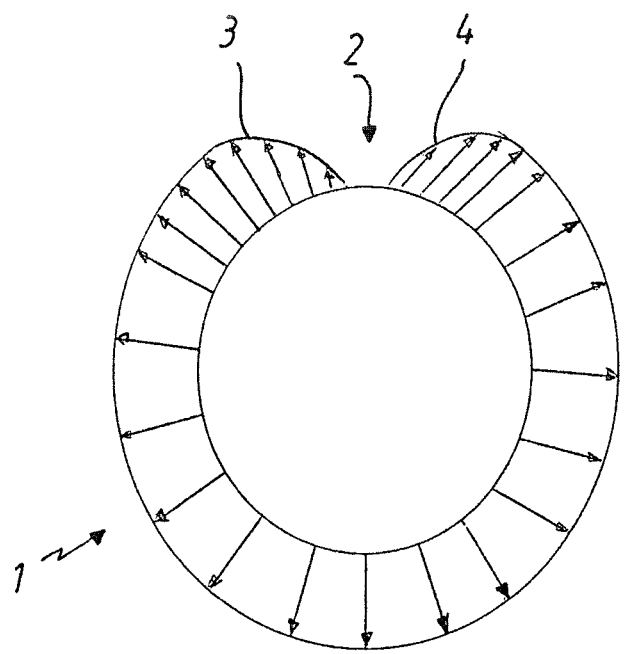
FIG. 1 shows a schematic diagram of a piston ring base body in which the radial pressure distribution is indicated.

FIG. 1 shows a piston ring base body 1 provided with a joint 2, which is only indicated by a gap in the radial pressure distribution of the piston ring base body 1. The radial pressure distribution of the piston ring base body 1 in the cold state is indicated by arrows. The inner circle, schematically, representing the outer circumference of the piston ring base body 1, spans the joint to show that, of course, there is no radial pressure at the joint, i.e., at the gap between the piston ring base body ends. The outer line is a visual representation of the radial pressure of the piston ring base body. The further the outer line is from the inner circle, the greater is the radial pressure of the piston ring base body. It is apparent that, with the exception of the end regions 3, 4 close to the joint, the piston ring base body 1 has approximately the same radial pressure, seen in the circumferential direction, in the direction of the end regions 3, 4 close to the joint, which preferably extend across a circumferential angle between 10 and 40°, the radial pressure distribution is to be reduced to ranges that are close to 0. This may be achieved, for example, by providing the piston ring base body 1 with a negative contour in the end regions 3, 4 close to the joint, meaning that at the end regions the piston ring base body 1 deviate inwardly from a circular configuration.

Figure 2:
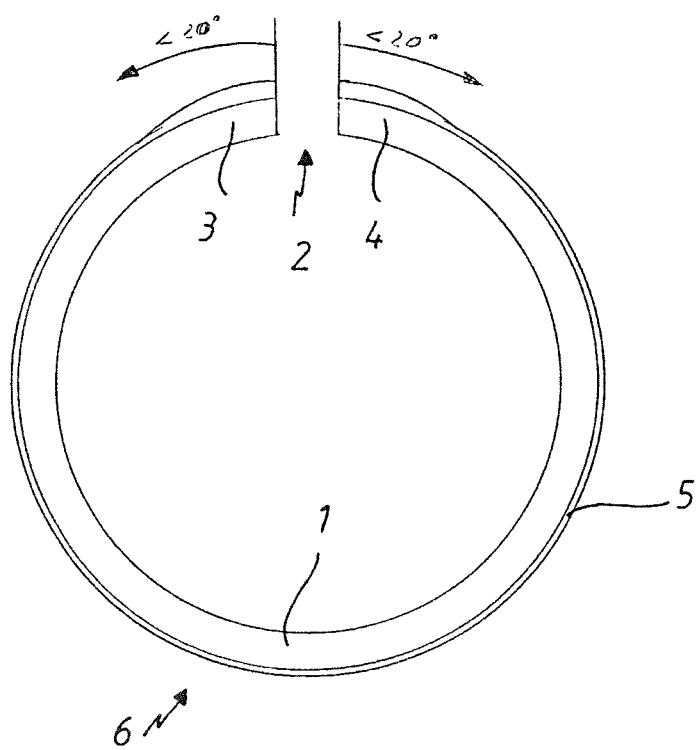
FIG. 2 shows a schematic diagram of a piston ring base body according to FIG. 1 provided with a PVD layer.

FIG. 2 shows a piston ring base body according to FIG. 1. The joint 2 and the end regions 3, 4 close to the joint are apparent. The piston ring base body 1 is to be made of cast steel in this example and have a coefficient of expansion of $11 \times 10^{-6}$/K. A PVD layer 5 is deposited onto the outer circumferential surface forming the running face and, according to the invention, has an increased layer thickness in the region of the end regions 3, 4 of the piston ring base body 1 which are close to the joint. For this purpose, PVD multi-layer systems, such as AlTiN/CrN or homogeneous layers such as CrN having an oxygen content of up to 15% by weight may be used. A suitable CrN PVD wear protection layer has a coefficient of thermal expansion of approximately $3 \times 10^{-6}$/K. Layer hardnesses between 800 and 2500 HV are achievable for such CrN-based layers, or alternatively, if needed, layer hardnesses of up to 4500 HV, or even higher if necessary, such as 8000 HV, are achievable for carbon-based layers.

In the present example, the layer thickness of the PVD layer 5 is to be approximately 42 μm in the region of the end regions 3, 4 close to the joint, and approximately 15 μm in the region of the ring back 6, i.e., the remainder of the ring.

As a result of the bimetallic effect, which cannot be suppressed, in the ideal application case, the piston ring base body 1 produced in accordance with FIG. 1 will have a substantially uniform radial pressure distribution across the ring circumference starting at a piston ring temperature of 150° C.

The invention claimed is:

1. A method for producing a piston ring, comprising providing a piston ring base body made of cast iron or cast steel and having ends separated by a gap comprising a joint, coating an outer circumferential surface of the piston ring base body with at least one PVD layer of varying thickness which is greater in a region of each of the ring ends of predetermined circumferential angle than in a remaining circumferential region of the circumferential surface thereby to produce the piston ring having a running face formed of the at least one PVD layer, wherein the piston ring base body is configured so that, installed in a cold engine which is not running, a radial pressure distribution of the piston ring is such that the ring ends over said predetermined circumferential angle exhibit substantially no radial pressure and the varying of the thickness of the at least one PVD layer is predetermined so that radial pressure over the entire piston ring circumference at a piston ring temperature above 150° C. is substantially uniform.

2. The method according to claim 1, wherein the thickness of the at least one PVD layer in the region of the ring ends is <100 μm and the thickness of the at least one PVD layer in the remaining circumferential region of the piston ring base body is <60 μm provided that in all instances the thickness of the at least one PVD layer is substantially greater in the piston ring ends region than in the remaining circumferential region of the piston ring.

3. The method according to claim 1, wherein the at least one PVD layer is a PVD multi-layer system.

4. The method according to claim 1, wherein the at least one PVD layer is a homogeneous layer comprising CrN, CrN(O) or CrN having an oxygen content of up to 15% by weight.

5. The method according to claim 1, wherein the at least one PVD layer is carbon-based layer.

6. The method according to claim 1, wherein the at least one PVD layer has a coefficient of expansion $<4 \times 10^{-6}$/K in a temperature range from 100 to 200° C. and is applied to a piston ring base having a coefficient of expansion $<15 \times 10^{-6}$/K in the temperature range from 100 to 200° C.

7. The method according to claim 1, wherein the thickness of the at least one PVD layer in the ring ends region is 20 to 40% greater than in the remaining circumferential region of the piston ring.

8. The method according to claim 1, wherein the thickness of the at least one PVD layer in the piston ring ends region is <60 μm and in the remaining circumferential region of the piston ring is <40 μm.

9. The method according to claim 1, wherein the multi-layer system comprises a layer of AlTiN and a layer of CrN.

10. A piston ring produced according to the method of claim 1.

11. The piston ring according to claim 10, wherein the thickness of the at least one PVD layer in the region of the ring ends is from 20 to 40% greater than in the remaining circumferential region.

12. The piston ring according to claim 11, wherein the thickness of the at least one PVD layer in the region of the ring ends is from 40 to 100 μm and from 5 to 60 μm in the remaining circumferential region.

13. The piston ring according to claim 12, wherein the region of each of the ring ends in which the thickness of the at least one PVD layer is greater in a circumferential region of the ring beginning at the ring ends and extending away from the ring end from 10 to 40°.

14. The piston ring according to claim 13, wherein the piston ring base body is made of a steel having a coefficient of thermal expansion $<15 \times 10^{-6}$/K in a temperature range of 100 to 200° C.

15. The piston ring according to claim 10, wherein the at least one PVD layer is as a multi-layer system comprised of a layer of AlTiN and a layer of CrN or a homogeneous layer of CrN, CrN(O) or CrN having an oxygen content of up to 15% by weight, wherein the at least one PVD layer has a coefficient of thermal expansion $<4 \times 10^{-6}$/K in a temperature range of 100 to 200° C., the thickness of the at least one PVD layer in the region of the joint ends is in a range of 40 to $<100$ μm and in a range of 5 to $<40$ μm in the remaining circumferential region.

16. The piston ring according to claim 14, wherein the at least one PVD layer is carbon-based and has a coefficient of thermal expansion $<2 \times 10^{-6}$/K in a temperature range of 100 to 200° C., the thickness of the at least one PVD layer is a maximum of 30 μm in the region of the ring ends and is in a range of $>1$ and 20 μm in the remaining circumferential region of the piston ring.

17. The piston ring according to claim 10, wherein the at least one PVD layer comprises nanoparticles.

18. The piston ring according to claim 13, wherein the region of each of the ring ends in which the thickness of the at least one PVD layer is greater extends away from the ring end 10 to 20°.

\* \* \* \* \*